United States Patent
Plesski

(10) Patent No.: US 10,797,675 B2
(45) Date of Patent: Oct. 6, 2020

(54) TRANSVERSELY EXCITED FILM BULK ACOUSTIC RESONATOR USING ROTATED Z-CUT LITHIUM NIOBATE

(71) Applicant: Resonant Inc., Goleta, CA (US)

(72) Inventor: Viktor Plesski, Gorgier (CH)

(73) Assignee: Resonant Inc., Goleta, CA (US)

( * ) Notice: Subject to any disclaimer, the term of this patent is extended or adjusted under 35 U.S.C. 154(b) by 0 days.

(21) Appl. No.: 16/518,594

(22) Filed: Jul. 22, 2019

(65) Prior Publication Data
US 2019/0386633 A1    Dec. 19, 2019

Related U.S. Application Data

(63) Continuation-in-part of application No. 16/438,141, filed on Jun. 11, 2019, now Pat. No. 10,601,392, which is a continuation-in-part of application No. 16/230,443, filed on Dec. 21, 2018, now Pat. No. 10,491,192, application No. 16/518,594, which is a
(Continued)

(51) Int. Cl.
| | | |
|---|---|---|
| H03H 9/02 | (2006.01) | |
| H03H 3/02 | (2006.01) | |
| H03H 9/54 | (2006.01) | |
| H03H 9/13 | (2006.01) | |

(52) U.S. Cl.
CPC ......... *H03H 9/02015* (2013.01); *H03H 3/02* (2013.01); *H03H 9/13* (2013.01); *H03H 9/54* (2013.01)

(58) Field of Classification Search
CPC ........ H03H 9/02015; H03H 3/02; H03H 9/13; H03H 9/54

USPC ........................................ 333/186, 187, 189
See application file for complete search history.

(56) References Cited

U.S. PATENT DOCUMENTS

| | | |
|---|---|---|
| 6,540,827 B1 | 4/2003 | Levy et al. |
| 7,463,118 B2 | 12/2008 | Jacobsen |
| 7,535,152 B2 | 5/2009 | Ogami et al. |

(Continued)

OTHER PUBLICATIONS

Naumenko et al., "Optimal orientations of Lithium Niobate for resonator SAW filters", 2003 IEEE Ultrasonics Symposium—pp. 2110-2113. (Year: 2003).*

(Continued)

*Primary Examiner* — Benny T Lee
*Assistant Examiner* — Hafizur Rahman
(74) *Attorney, Agent, or Firm* — SoCal IP Law Group LLP; John E. Gunther

(57) ABSTRACT

Acoustic resonator devices, filters, and methods are disclosed. An acoustic resonator includes a substrate and a lithium niobate (LN) plate having parallel front and back surfaces, the back surface attached to a surface of the substrate except for a portion of the LN plate forming a diaphragm that spans a cavity in the substrate. An interdigital transducer (IDT) is formed on the front surface of the LN plate such that interleaved fingers of the IDT are disposed on the diaphragm. The IDT is configured to excite a primary acoustic mode in the diaphragm in response to a radio frequency signal applied to the IDT. A direction of acoustic energy flow of the primary acoustic mode is substantially orthogonal to the surfaces of the diaphragm. The Euler angles of the LN plate are 0°, β, 90°, where β is greater than or equal to −15° and less than 0°.

20 Claims, 12 Drawing Sheets

Related U.S. Application Data continuation-in-part of application No. 16/230,443, filed on Dec. 21, 2018, now Pat. No. 10,491,192.

(60) Provisional application No. 62/842,161, filed on May 2, 2019, provisional application No. 62/818,564, filed on Mar. 14, 2019, provisional application No. 62/753,809, filed on Oct. 31, 2018, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(56) References Cited

U.S. PATENT DOCUMENTS

| | | | |
|---|---|---|---|
| 7,684,109 | B2 | 3/2010 | Godshalk et al. |
| 7,868,519 | B2 | 1/2011 | Umeda |
| 8,932,686 | B2 | 1/2015 | Hayakawa et al. |
| 9,219,466 | B2 | 12/2015 | Meltaus et al. |
| 9,369,105 | B1 * | 6/2016 | Li .................. H03H 9/0542 |
| 9,425,765 | B2 | 8/2016 | Rinaldi |
| 9,525,398 | B1 | 12/2016 | Olsson |
| 9,780,759 | B2 | 10/2017 | Kimura et al. |
| 2011/0109196 | A1 | 5/2011 | Goto |
| 2013/0234805 | A1 | 9/2013 | Takahashi |
| 2014/0145556 | A1 | 5/2014 | Kadota |
| 2014/0151151 | A1 | 6/2014 | Reinhardt |
| 2015/0333730 | A1 | 11/2015 | Meltaus |
| 2019/0068164 | A1 | 2/2019 | Houlden et al. |
| 2019/0131953 | A1 * | 5/2019 | Gong .................. H03H 9/02574 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945.

* cited by examiner

TRANSVERSELY EXCITED FILM BULK ACOUSTIC RESONATOR USING ROTATED Z-CUT LITHIUM NIOBATE

RELATED APPLICATION INFORMATION

This patent claims priority to provisional application 62/842,161, titled XBAR RESONATORS ON ROTATED Z-CUT LITHIUM NIOBATE, filed May 2, 2019. This patent is a continuation-in-part of application Ser. No. 16/230,443, filed Dec. 21, 2018, titled TRANSVERSELY-EXCITED FILM BULK ACOUSTIC RESONATOR, which has been issued as a U.S. Pat. No. 10,491,192 on 11/26/2019, which claims priority from the following provisional applications: application 62/685,825, filed Jun. 15, 2018, entitled SHEAR-MODE FEAR (XBAR); application 62/701,363, filed Jul. 20, 2018, entitled SHEAR-MODE FEAR (XBAR); application 62/741,702, filed Oct. 5, 2018, entitled 5 GHZ LATERALLY-EXCITED BULK WA VE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. This patent is a continuation-in-part of application Ser. No. 16/381,141, filed Jun. 11, 2019, titled SOLIDLY MOUNTED TRANSVERSELY-EXCITED FILM BULK ACOUSTIC RESONATOR, which has been issued as a U.S. Pat. No. 10,603,149 on 03/31/2020, which is a continuation-in-part of application Ser. No. 16/230,443, and claims priority from provisional patent application 62/753,809, filed Oct. 31, 2018, titled SOLIDLY MOUNTED SHEAR-MODE FILM BULK ACOUSTIC RESONATOR, and provisional patent application 62/818,564, filed Mar. 14, 2019, titled SOLIDLY MOUNTED XBAR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to filters, oscillators, sensors and other radio frequency devices using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously described element having the same reference designator.

DETAILED DESCRIPTION

Description of Apparatus

Figure 1:
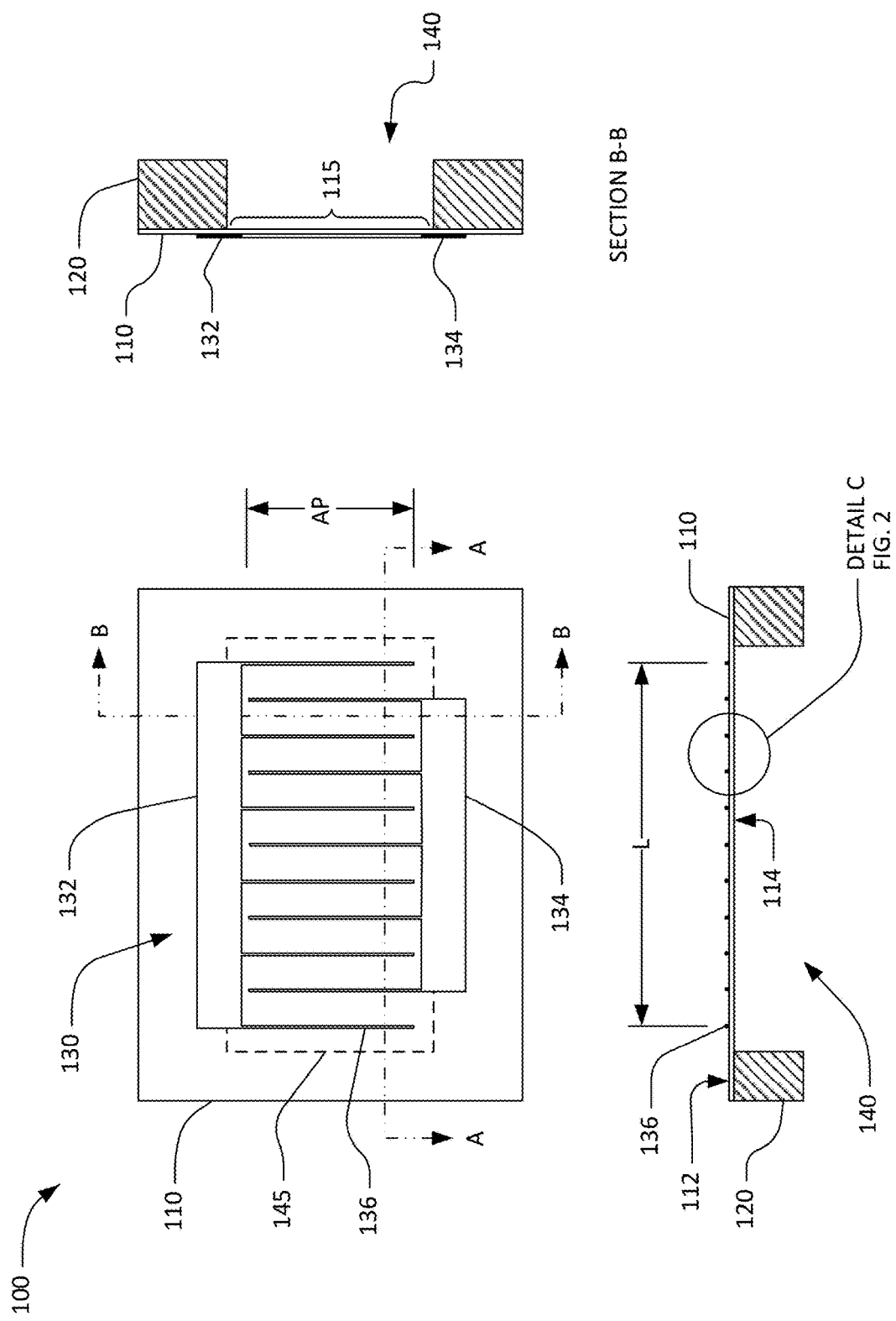
FIG. 1 includes a schematic plan view and two schematic cross-sectional views of a transversely excited film bulk acoustic resonator (XBAR).

FIG. 1 shows a simplified schematic top view and orthogonal cross-sectional views of a transversely excited film bulk acoustic resonator (XBAR) 100. XBARs were first described in application Ser. No. 16/230,443. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of lithium niobate. The piezoelectric plate is cut such that the orientation of the x, y, and z crystalline axes with respect to the front and back surfaces is known and consistent. In particular, the piezoelectric plate 110 is rotated z-cut, which is to say the z crystalline axis is inclined by a small rotation angle relative to the normal to the front and back surfaces 112, 114. As will be discussed in further detail, the small rotation angle is defined by the second Euler angle of the piezoelectric plate.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the cavity 140 is a hole though the substrate 110. In other configurations, the cavity 140 may be a recess in the substrate 120. Also as shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, there may be openings through the piezoelectric plate 110 (for example to allow etching of the cavity beneath the piezoelectric plate). In this case, the diaphragm 115 will be contiguous with the rest of the piezoelectric plate 110 around at least 50% of the perimeter 145 of the cavity.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates back and forth along a direction substantially orthogonal to the surface of the piezoelectric plate 110, which is also normal, or transverse, to the primary direction of the electric field created between the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
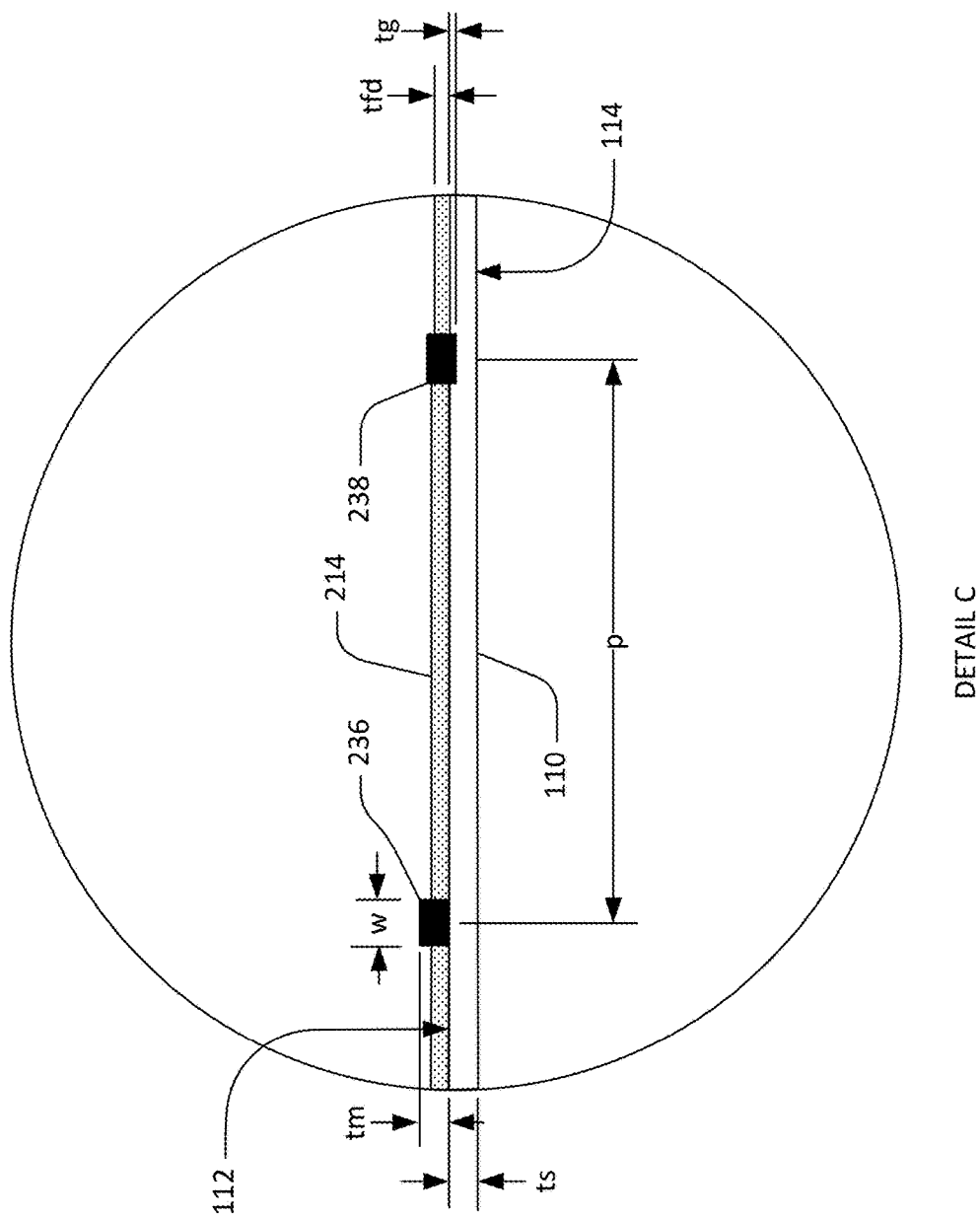
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of Lithium Niobate piezoelectrical material having parallel front and back surfaces 112, 114 and a thickness ts. ts may be, for example, 100 nm to 1500 nm. When used in filters for LTE™ bands from 3.4 GHZ to 6 GHz (e.g. LTE™ bands 42, 43, 46), the thickness ts may be, for example, 300 nm to 700 nm.

The IDT fingers, such as IDT finger 236, may be disposed on the front surface 112 of the piezoelectric plate 110.

Alternatively, IDT fingers, such as IDT finger 238, may be disposed in groves formed in the front surface 112. The IDT fingers 236, 238 may be aluminum, substantially aluminum alloys, copper, substantially copper alloys, beryllium, gold, tungsten, molybdenum or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the wavelength of the horizontally-propagating surface acoustic wave at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 112. The width of the IDT fingers in an XBAR is not constrained to one-fourth of the acoustic wavelength at resonance. For example, the width of XBAR IDT fingers may be 500 nm or greater, such that the IDT can be fabricated using optical lithography.

The thickness tm of the IDT fingers may be from 100 nm to about equal to the width w. The thickness of the busbars (132, 134 in FIG. 1) of the IDT may be the same as, or greater than, the thickness tm of the IDT fingers. The depth tg of the grooves formed in the front surface may be less than (as shown in FIG. 2), equal to, or greater than tm.

A front-side dielectric layer 214 may optionally be formed on the front surface 112 of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236, 238. Although not shown in FIG. 2, the front side dielectric layer 214 may also be deposited over the IDT fingers 238. The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials. The front-side dielectric layer may be deposited, for example by evaporation, sputtering, chemical vapor deposition, or some other technique.

Figure 3:
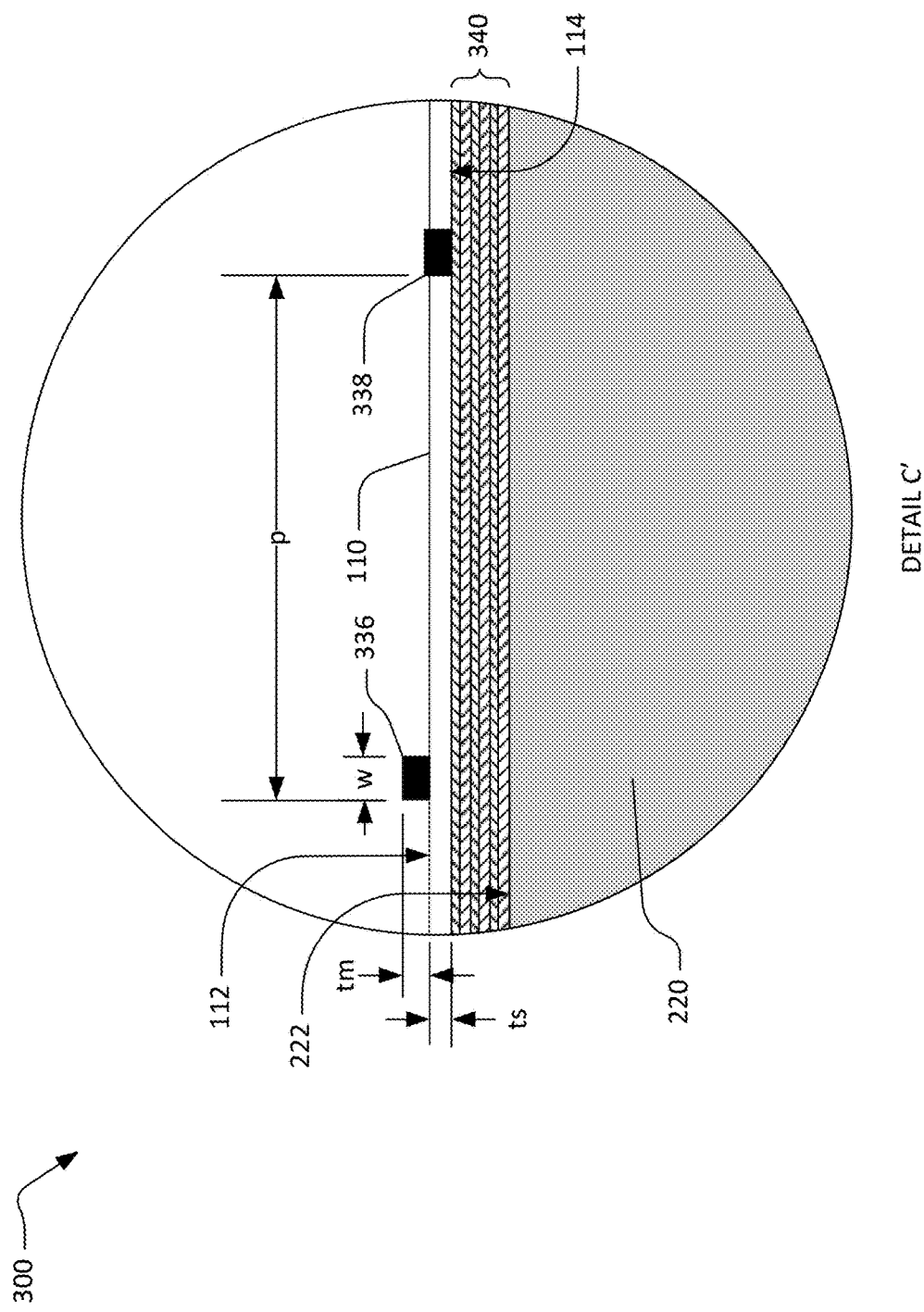
FIG. 3 is an alternative expanded schematic cross-sectional view of an XBAR.

FIG. 3 shows a detailed schematic cross-sectional view of a solidly mounted XBAR (SM XBAR) 300. SM XBARs were first described in application Ser. No. 16/381,141. The SM XBAR 300 includes a piezoelectric plate 110, an IDT (of which only fingers 236 are visible) and an optional front-side dielectric layer 214 as previously described. The piezoelectric layer 110 has parallel front and back surfaces 112, 114. Dimension ts is the thickness of the piezoelectric plate 110. The width of the IDT fingers 236 is dimension w, thickness of the IDT fingers is dimension tm, and the IDT pitch is dimension p. The thickness of the front-side dielectric layer 214 is dimension tfd.

In contrast to the XBAR devices shown in FIG. 1 and FIG. 2, the IDT of an SM XBAR is not formed on a diaphragm spanning a cavity in the substrate 120. Instead, an acoustic Bragg reflector 340 is sandwiched between a surface 222 of the substrate 220 and the back surface 114 of the piezoelectric plate 110. The term "sandwiched" means the acoustic Bragg reflector 340 is both disposed between and mechanically attached to a surface 222 of the substrate 220 and the back surface 114 of the piezoelectric plate 110. In some circumstances, thin layers of additional materials may be disposed between the acoustic Bragg reflector 340 and the surface 222 of the substrate 220 and/or between the Bragg reflector 340 and the back surface 114 of the piezoelectric plate 110. Such additional material layers may be present, for example, to facilitate bonding the piezoelectric plate 110, the acoustic Bragg reflector 340, and the substrate 220.

The acoustic Bragg reflector 340 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 340 has a thickness equal to, or about, one-fourth of the wavelength of a shear bulk wave having the same polarization as the primary acoustic mode at or near a resonance frequency of the SM XBAR 300. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide. All of the high acoustic impedance layers of the acoustic Bragg reflector 340 are not necessarily the same material, and all of the low acoustic impedance layers are not necessarily the same material. In the example of FIG. 3, the acoustic Bragg reflector 340 has a total of six layers. An acoustic Bragg reflector may have more than, or less than, six layers.

The IDT fingers, such as IDT finger 336, may be disposed on the front surface 112 of the piezoelectric plate 110. Alternatively, IDT fingers, such as IDT finger 338, may be disposed in groves formed in the front surface 112. The grooves may extend partially through the piezoelectric plate, as shown in FIG. 2. Alternatively, the grooves may extend completely through the piezoelectric plate as shown in FIG. 3.

Figure 4:
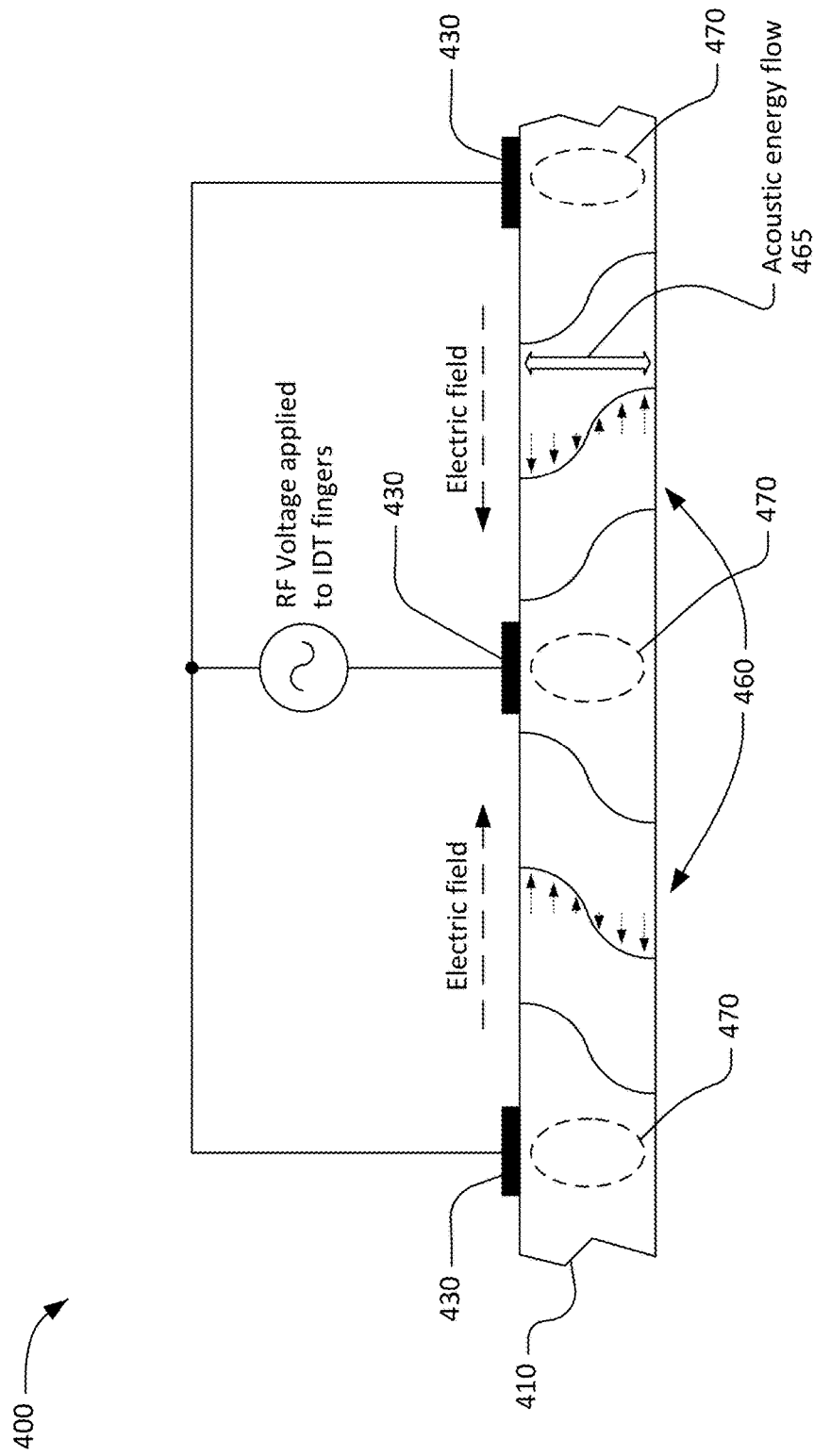
FIG. 4 is a graphic illustrating a shear horizontal acoustic mode in an XBAR.

FIG. 4 is a graphical illustration of the primary acoustic mode in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the electric energy is highly concentrated in the plate relative to the air. The lateral electric field introduces shear deformation, and thus strongly excites a shear-mode acoustic mode, in the piezoelectric plate 410. In this context, "shear deformation" is defined as deformation in which atomic displacements are horizontal but vary in a vertical direction. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of physical motion of the piezoelectric media. The degree of physical motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

In an SM XBAR, as shown in FIG. 3, the motion distribution in the piezoelectric plate is similar. However the thickness of the plate is not necessarily close to one-half of the wavelength of the primary acoustic mode, and some part of acoustic energy is localized in the Bragg stack, in shear vibrations with amplitude exponentially decaying in the depth of the stack.

Considering FIG. 4, there is essentially no horizontal electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the metal IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. This compression/extension of the elastic media is responsible for additional adiabatic loss mechanism absent for pure shear waves. In addition, the strongest coupling in lithium niobate and lithium tantalate corresponds to the shear deformations. Thus, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
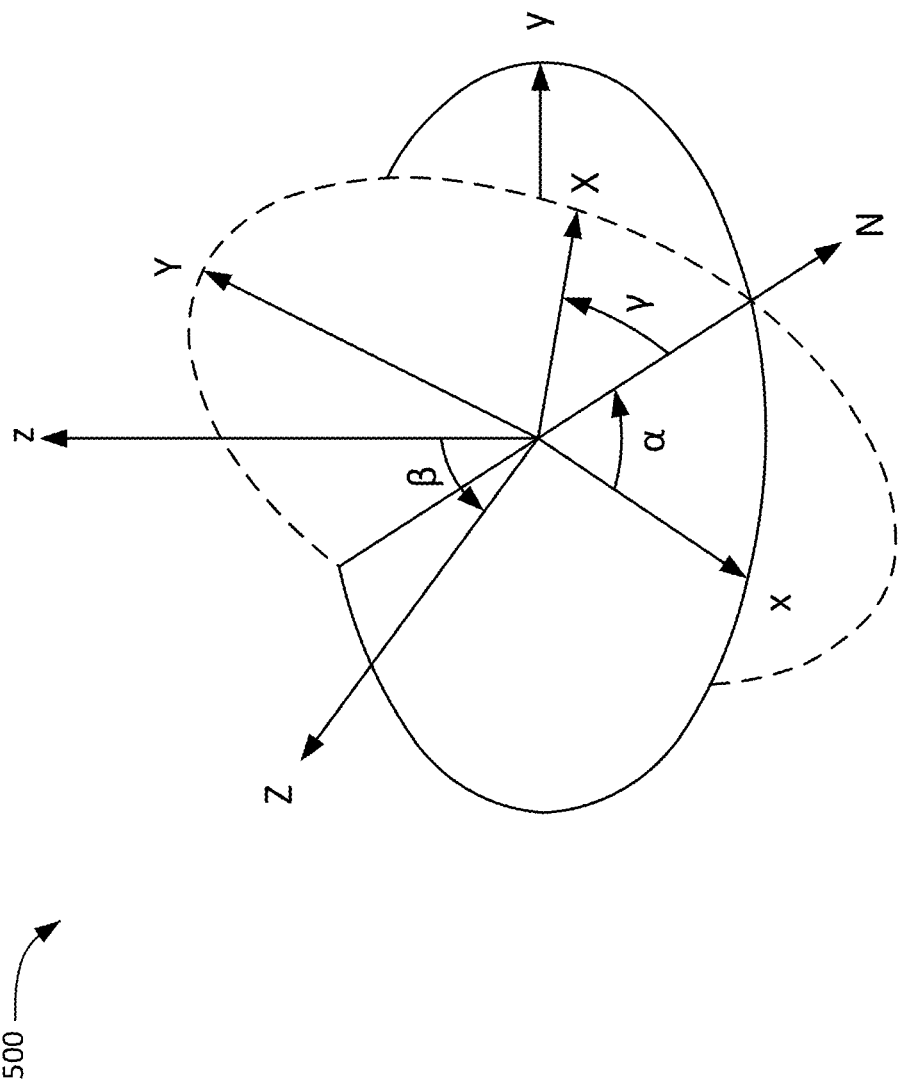
FIG. 5 is a graphical representation of Euler angles.

FIG. 5 is a graphical illustration 500 of Euler angles. Euler angles are a system, introduced by Swiss mathematician Leonhard Euler, to define the orientation of a body with respect to a fixed coordinate system (x,y,z). The orientation is defined by three successive rotations about angles $\alpha$, $\beta$, and y. Note that N is the line of intersection of the planes xy and XY or the common perpendicular to the axes z and Z.

As applied to acoustic wave devices, xyz is a three-dimensional coordinate system aligned with the crystalline axes of the piezoelectric material. XYZ is a three-dimensional coordinate system aligned with the acoustic wave device, where Z is normal to the surface of the piezoelectric material. XY is the plane of the surface of the piezoelectric material. X is the direction of the electric field and acoustic wave propagation for SAW and most plate-mode devices, and Y is typically parallel to the fingers on an IDT. In XBAR devices, X is the direction of the electric field, but acoustic wave propagation is dominantly along the Z direction. All of the XBAR devices described in application Ser. No. 16/230,443 and application Ser. No. 16/381,141 use piezoelectric plates with the z axis normal to the plate surface and the y axis orthogonal to the IDT fingers. Such piezoelectric plates have Euler angles of 0, 0, 90°.

Figure 6:
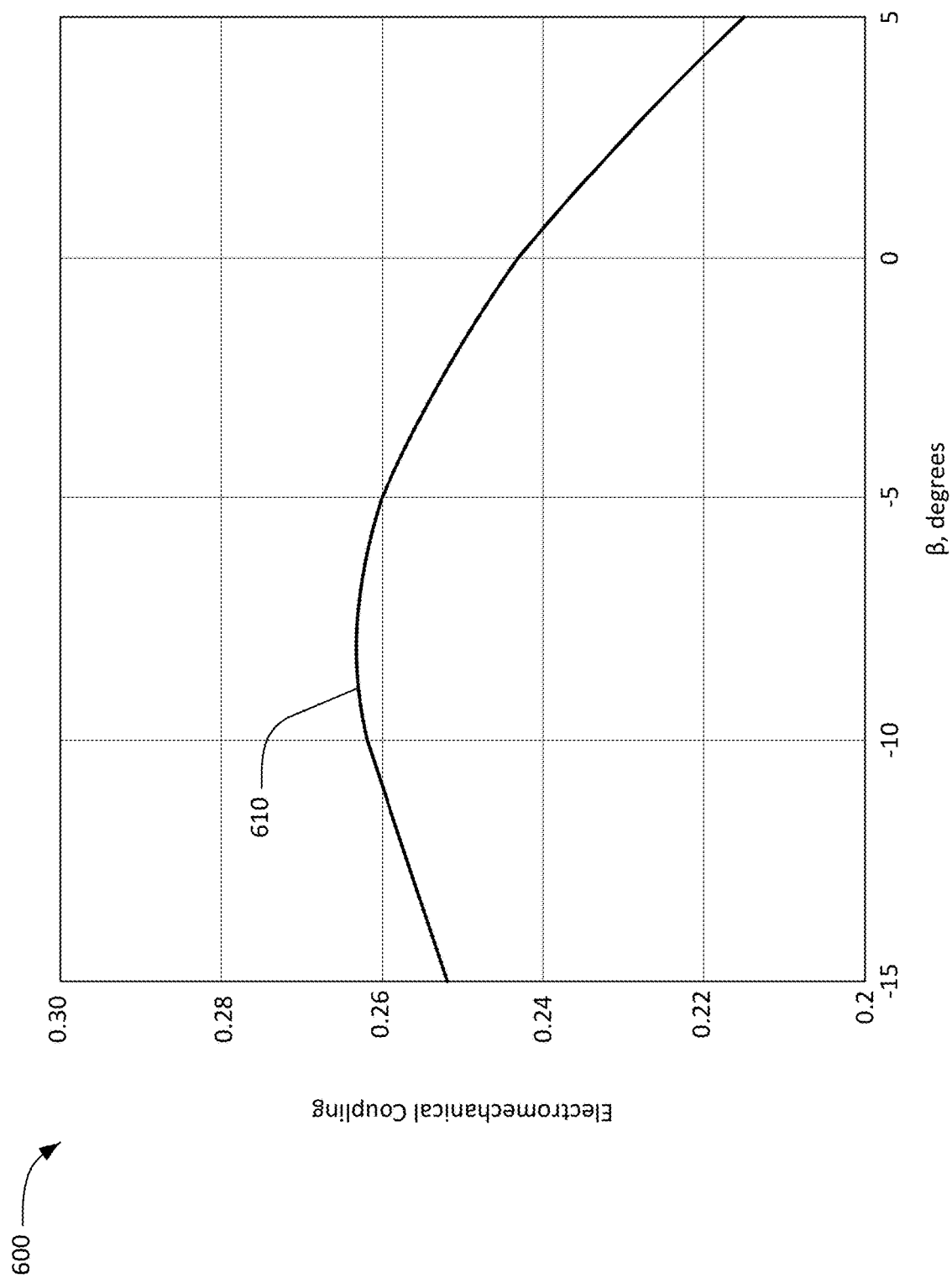
FIG. 6 is a chart of the electromechanical coupling of an XBAR as a function of Z-axis tilt angle $\beta$.

FIG. 6 is a chart 600 of the electromechanical coupling coefficient of representative XBAR devices using piezoelectric plates with Euler angles 0, $\beta$, 90°, where $\beta$ is in the range from −15° to +5°. The charts in FIG. 6, FIG. 7, FIG. 8, and FIG. 9 are based on simulation of XBAR devices using finite element methods. The line 610 is a plot of electromechanical coupling coefficient as a function of $\beta$. Inspection of the chart 600 shows that the electromechanical coupling coefficient is greater than 0.26 for $\beta$ greater than or equal to −11° and less than or equal to −5°, as compared to a value of about 0.243 for $\beta$=0.

Figure 7:
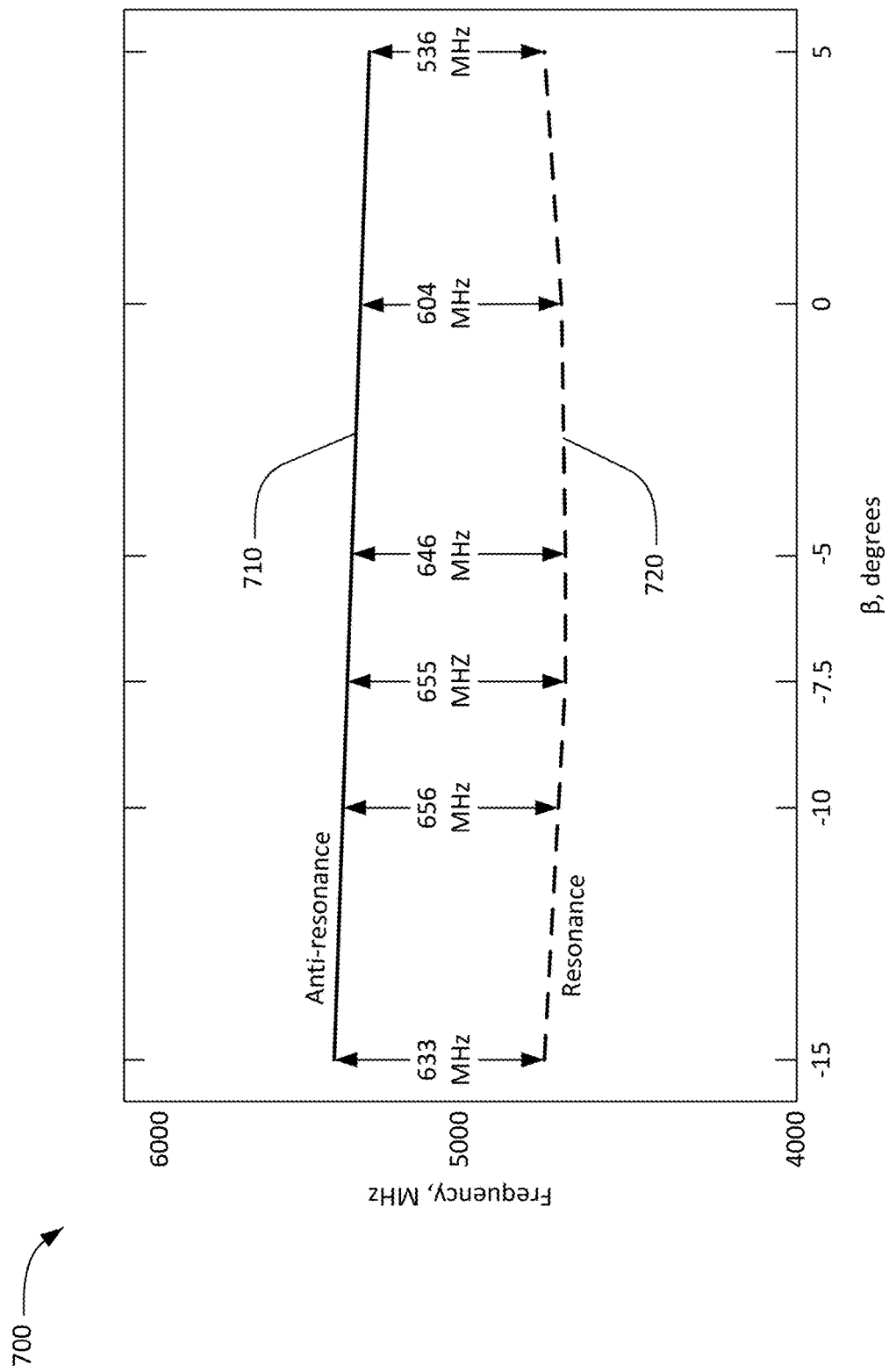
FIG. 7 is a chart of the resonance and anti-resonance frequencies of an XBAR as a function of Z-axis tilt angle β.

An increase in electromechanical coupling coefficient by 0.017 effectively increases the frequency difference between the resonance and anti-resonance frequencies of an XBAR, as shown in FIG. 7. FIG. 7 is a chart 700 of the resonance and anti-resonance frequencies of representative XBAR devices using piezoelectric plates with Euler angles 0, $\beta$, 90°. The solid line 710 is a plot of anti-resonance frequency as a function of $\beta$. The dashed line 720 is a plot of resonance frequency as a function of $\beta$. Inspection of the chart 700 shows that the difference between the anti-resonance and resonance frequencies is about 655 MHz for $\beta$ greater than or equal to −10° and less than or equal to −7.5°, as compared to 604 MHz for $\beta$=0. A 50 MHz, of about 8%, increase in the difference between the anti-resonance and resonance frequencies of a resonator facilitates the design of broad bandwidth band-pass filters.

Figure 8:
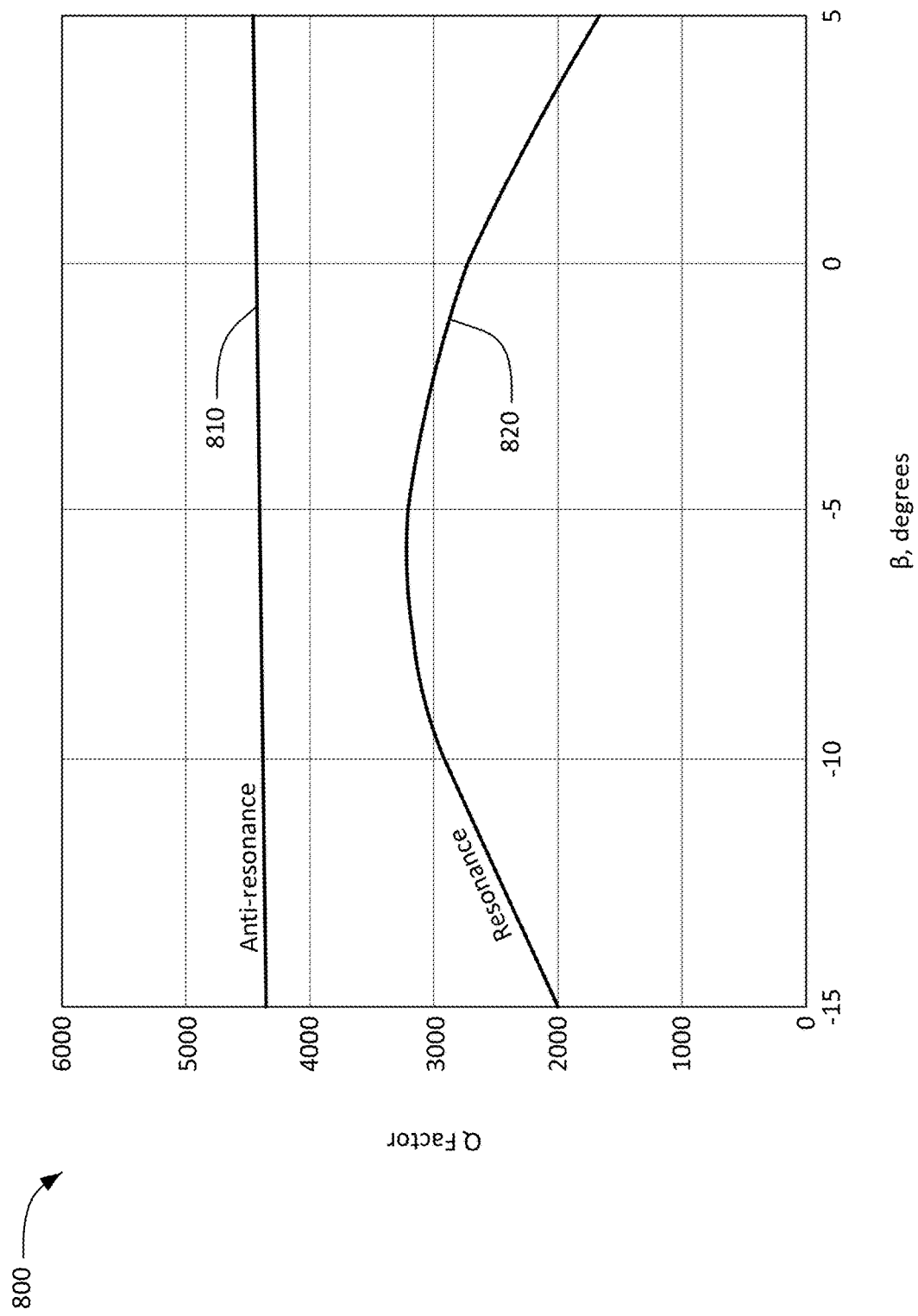
FIG. 8 is a chart of the Q factor at the resonance and anti-resonance frequencies of an XBAR as a function of Z-axis tilt angle β.

FIG. 8 is a chart 800 of the Q-factor at the resonance and anti-resonance frequencies of representative XBAR devices using piezoelectric plates with Euler angles 0, $\beta$, 90°. In determining Q-factor, only material losses (i.e. acoustic absorption) in the piezoelectric plate and electrodes are considered. Resistive losses in the electrodes and side and edge radiation effects, all of which are nearly independent of $\beta$ are ignored. The line 810 is a plot of Q-factor at the anti-resonance frequency as a function of $\beta$. The line 820 is a plot of Q-factor at the resonance frequency as a function of $\beta$. Inspection of the chart 800 shows that the Q-factor at the anti-resonance frequency is relatively independent of $\beta$, and the Q-factor at the resonance frequency is maximum for $\beta$= about −6°. The Q-factor at the resonance frequency is above 3000 for $\beta$=0 greater than or equal to −9° and less than or equal to −2.5°, as compared to a Q-factor of about 2700 for $\beta$=0. An increase in the Q-factor at the resonance frequency may allow the development of band-pass filters with a sharper transition at the lower edge of the passband and/or lower insertion loss.

The improvement in Q-factor at the resonance frequency for $\beta$ greater than or equal to −9° and less than or equal to −2.5° can be explained by coincidence of the direction of the group and phase velocities at about these angles. For $\beta$=0, the group velocity has non-zero x-component, corresponding to the slight drift of energy outside the resonator.

Figure 9:
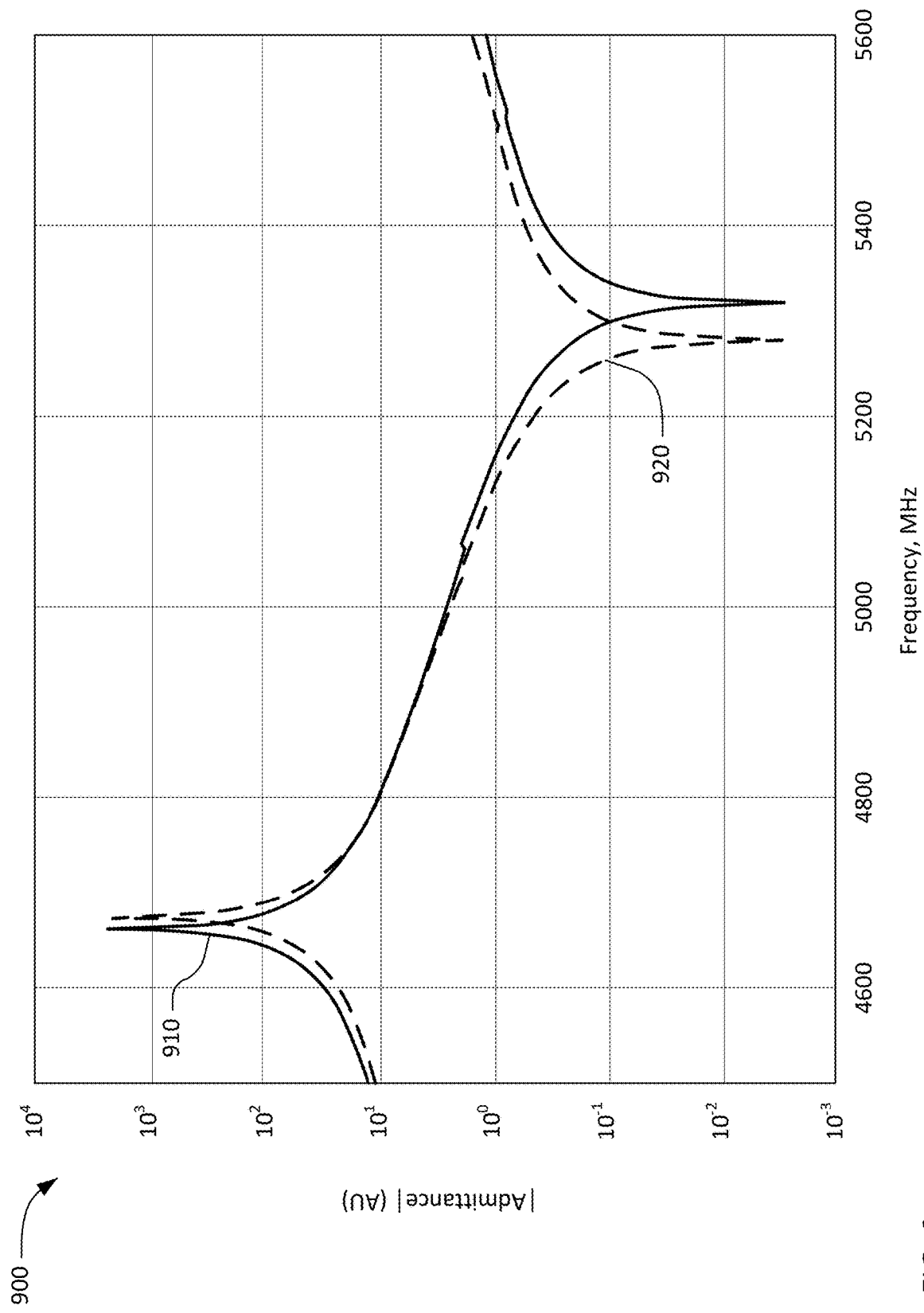
FIG. 9 is a chart of the admittance of two XBAR devices as functions of frequency.

FIG. 9 is a chart 900 showing the normalized magnitude of the admittance (on a logarithmic scale, where AU indicates corresponding admittance unit) as a function of frequency for two XBAR devices simulated using finite element method (FEM) simulation techniques. The dashed line 920 is a plot of the admittance on an XBAR on a Z-cut lithium niobate plate. In this case the Z crystalline axis is orthogonal to the surfaces of the plate and the Euler angles are 0, 0, 90°. The solid line 910 is a plot of the admittance of an XBAR on a −7.5° rotated Z-cut lithium niobate plate. In this case, the Z crystalline axis is inclined by +7.5° with respect to orthogonal to the surfaces of the plate and the Euler angles are 0, −7.5°, 90°. The IDT fingers are aluminum. The IDT is oriented such that the crystalline y-axis of the piezoelectric plate is normal to the IDT fingers. The substrate supporting the piezoelectric plate is silicon with a cavity formed under the IDT fingers. The simulated physical dimensions are as follows: is =400 nm; tfd=0; tm=300 nm; p=5 um; w=300 nm, AP=100 um, L=1 mm.

The difference between anti-resonance and resonance frequencies of the resonator on the rotated Z-cut plate (solid line 910) is significantly greater than the difference between anti-resonance and resonance frequencies of the resonator on the Z-cut plate (dashed line 920). This is indicative of the larger electromechanical coupling available with the rotated Z-cut plate.

Figure 10:
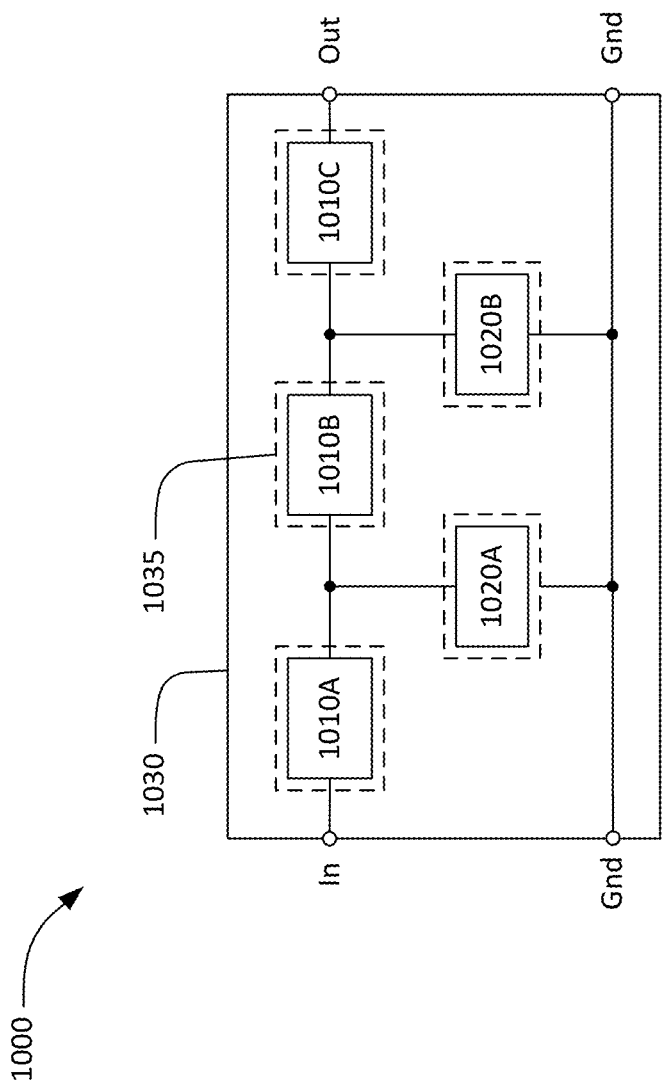
FIG. 10 is a schematic circuit diagram of a filter using XBARs.

FIG. 10 is a schematic circuit diagram for an exemplary embodiment of a high frequency band-pass filter 1000 using XBARs. The filter 1000 has a conventional ladder filter architecture including three series resonators 1010A, 1010B, 1010C and two shunt resonators 1020A, 1020B. The three series resonators 1010A, 1010B, and 1010C are connected in series between a first port and a second port. In FIG. 10, the first and second ports are labeled "In" and "Out", respectively. However, the filter 1000 is symmetrical and either port and serve as the input or output of the filter. The two shunt resonators 1020A, 1020B are connected from nodes between the series resonators to ground. All the shunt resonators and series resonators are XBARs or SM XBARs.

The three series resonators 1010A, 1010B, 1010C and the two shunt resonators 1020A, 1020B of the filter 1000 may be formed on a single plate 1030 of piezoelectric material bonded to a silicon substrate (not visible). Each resonator includes a respective IDT (not shown). When the resonators are XBARs, at least the fingers of each IDT are disposed over a cavity in the substrate. In FIG. 10, the cavities are illustrated schematically as the dashed rectangles (such as the rectangle 1035). In this example, each IDT is disposed over a respective cavity. In this and similar contexts, the term "respective" means "relating things each to each", which is to say with a one-to-one correspondence. In other filters, the IDTs of two or more resonators may be disposed over a single cavity. When the resonators are SM XBARs, the IDTs are disposed over an acoustic Bragg reflector as shown in FIG. 3.

Description of Methods

Figure 11:
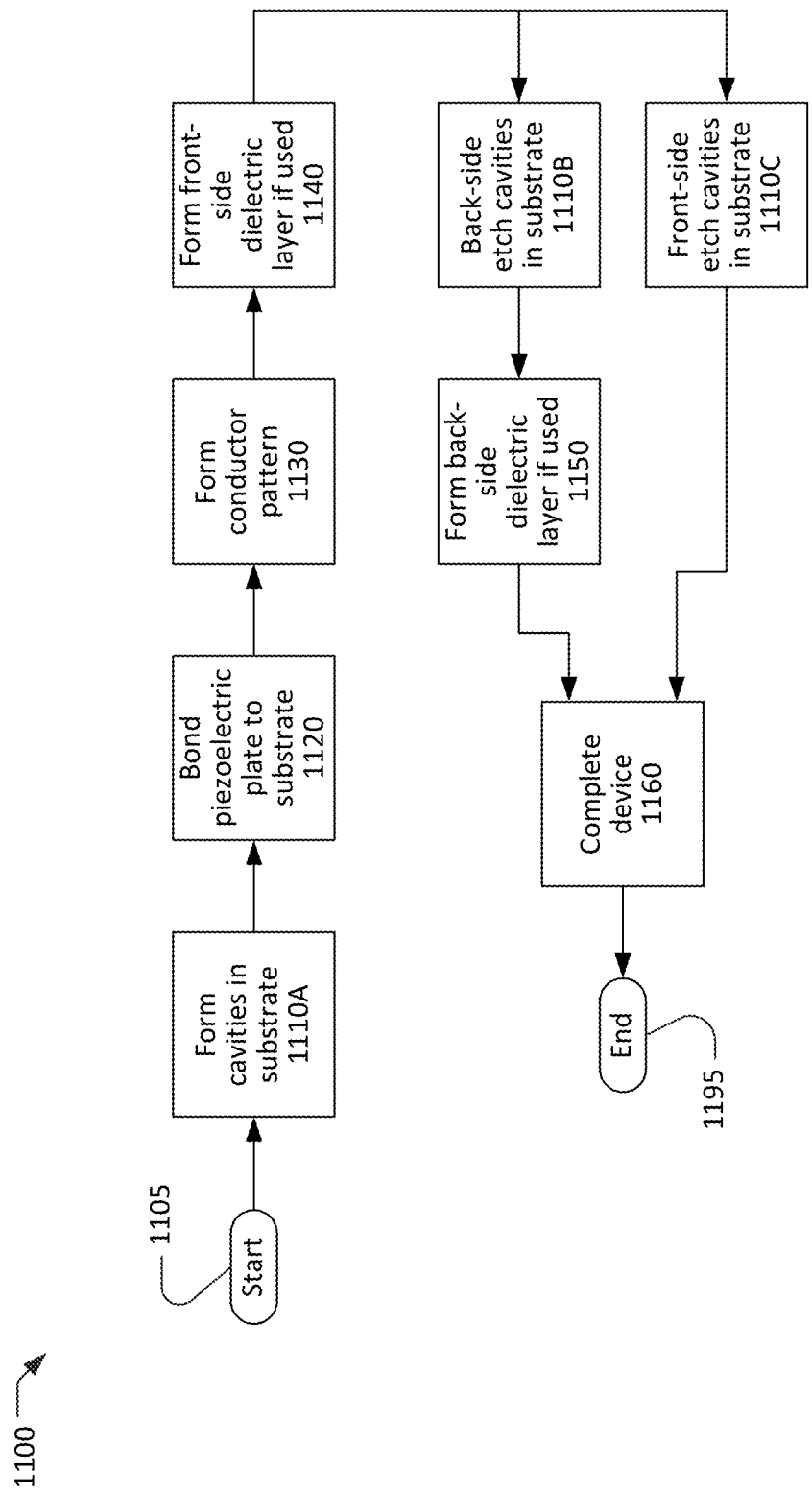
FIG. 11 is a flow chart of a process for fabricating an XBAR.

FIG. 11 is a simplified flow chart showing a process 1100 for making an XBAR or a filter incorporating XBARs. The process 1100 starts at 1105 with a substrate and a plate of piezoelectric material and ends at 1195 with a completed XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The flow chart of FIG. 11 captures three variations of the process 1100 for making an XBAR which differ in when and how cavities are formed in the substrate. The cavities may be formed at steps 1110A, 1110B, or 1110C. Only one of these steps is performed in each of the three variations of the process 1100.

The piezoelectric plate may be, for example, rotated Z-cut lithium niobate. The Euler angles of the piezoelectric plate are 0, β, 90°, where β is in the range from −15° to +5°. Preferably, β may be in the range from −11° to −5° to maximize electromechanical coupling. β may be in the range from −10° to −7.5° to maximize Q-factor at the resonance frequency. The substrate may preferably be silicon. The substrate may be some other material that allows formation of deep cavities by etching or other processing.

In one variation of the process 1100, one or more cavities are formed in the substrate at 1110A, before the piezoelectric plate is bonded to the substrate at 1120. A separate cavity may be formed for each resonator in a filter device. The one or more cavities may be formed using conventional photolithographic and etching techniques. Typically, the cavities formed at 1110A will not penetrate through the substrate.

At 1120, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1130 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1130 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1130 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1140, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1100, one or more cavities are formed in the back side of the substrate at 1110B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 1100, a back-side dielectric layer may be formed at 1150. In the case where the cavities are formed at 1110B as holes through the substrate, the back-side dielectric layer may be deposited through the cavities using a conventional deposition technique such as sputtering, evaporation, or chemical vapor deposition.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device.

In all variations of the process 1100, the filter device is completed at 1160. Actions that may occur at 1160 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1160 is to tune the resonant frequencies of the resonators within the device by adding or removing metal or dielectric material from the front side of the device. After the filter device is completed, the process ends at 1195.

Figure 12:
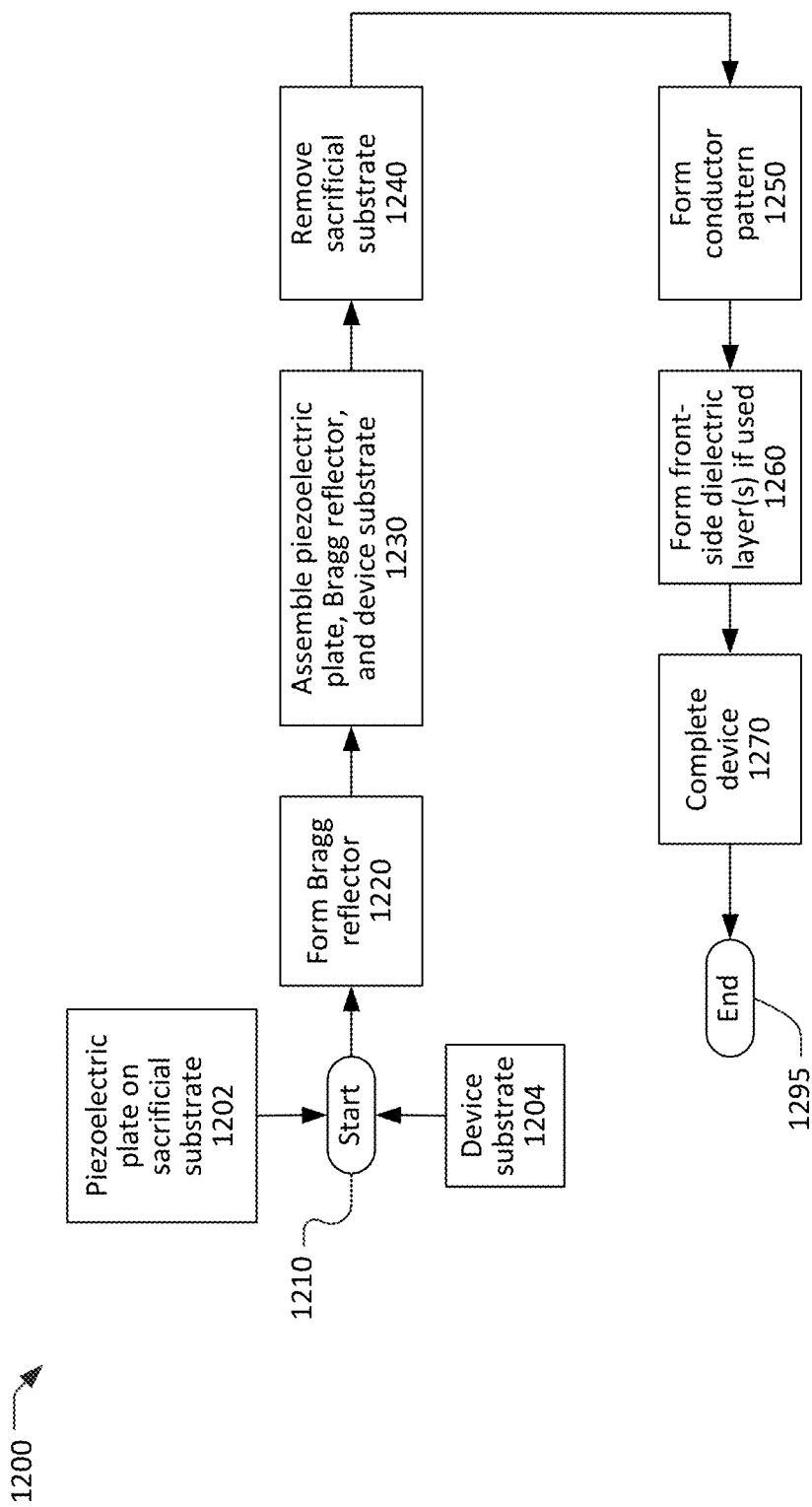
FIG. 12 is a flow chart of a process for fabricating a solidly mounted XBAR.

FIG. 12 is a simplified flow chart of a method 1200 for making a SM XBAR or a filter incorporating SM XBARs. The method 1200 starts at 1210 with a thin piezoelectric plate disposed on a sacrificial substrate 1202 and a device substrate 1204. The method 1200 ends at 1295 with a completed SM XBAR or filter. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

The piezoelectric plate 1202 may be, for example, rotated Z-cut lithium niobate. The Euler angles of the piezoelectric plate are 0, β, 90°, where β is in the range from −15° to +5°. Preferably, β may be in the range from −11° to −5° to maximize electromechanical coupling. β may be in the range from −10° to −7.5° to maximize Q-factor at the resonance frequency.

At 1220, an acoustic Bragg reflector is formed by depositing alternating dielectric layers of high acoustic impedance and low acoustic impedance materials. Each of the layers has a thickness equal to or about one-fourth of the acoustic wavelength. Dielectric materials having comparatively low acoustic impedance include silicon dioxide, silicon oxycarbide, and certain plastics such as cross-linked polyphenylene polymers. Dielectric materials having comparatively high acoustic impedance include silicon nitride and aluminum nitride. All of the high acoustic impedance layers are not necessarily the same material, and all of the low acoustic impedance layers are not necessarily the same material. The total number of layers in the acoustic Bragg reflector may be from about five to more than twenty.

At 1220, all of the layers of the acoustic Bragg reflector may be deposited on either the surface of the piezoelectric plate on the sacrificial substrate 1202 or a surface of the device substrate 1204. Alternatively, some of the layers of the acoustic Bragg reflector may be deposited on the surface of the piezoelectric plate on the sacrificial substrate 1202 and the remaining layers of the acoustic Bragg reflector may be deposited on a surface of the device substrate 1204.

At 1230, the piezoelectric plate on the sacrificial substrate 1202 and the device substrate 1204 may be bonded such that the layers of the acoustic Bragg reflector are sandwiched between the piezoelectric plate and the device substrate. The piezoelectric plate on the sacrificial substrate 1202 and the device substrate 1204 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1202 and the device substrate 1204 may be bonded, the sacrificial substrate, and any intervening layers, are removed at 1240 to expose the surface of the piezoelectric plate (the surface that previously faced the sacrificial substrate). The sacrificial substrate may be removed, for example, by material-dependent wet or dry etching or some other process.

A conductor pattern, including IDTs of each SM XBAR, is formed at 1250 by depositing and patterning one or more conductor layer on the surface of the piezoelectric plate that was exposed when the sacrificial substrate was removed at 1240. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1250 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1250 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1260, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1250 and 1260, the filter device may be completed at 1270. Actions that may occur at 1270 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1270 is to tune the resonant frequencies of the resonators within the device by adding or removing metal or dielectric material from the front side of the device. After the filter device is completed, the process ends at 1295.

A variation of the process 1200 starts with a single-crystal piezoelectric wafer at 1202 instead of a thin piezoelectric plate on a sacrificial substrate of a different material. Ions are implanted to a controlled depth beneath a surface of the piezoelectric wafer (not shown in FIG. 12). The portion of the wafer from the surface to the depth of the ion implantation is (or will become) the thin piezoelectric plate and the balance of the wafer is the sacrificial substrate. The acoustic Bragg reflector is formed at 1220 as previously described and the piezoelectric wafer and device substrate are bonded at 1230 such that the acoustic Bragg reflector is disposed between the ion-implanted surface of the piezoelectric wafer 1202 and the device substrate 1204. At 1240, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a rotated z-cut lithium niobate plate having front and back surfaces, the back surface attached to the surface of the substrate except for a portion of the lithium niobate plate forming a diaphragm that spans a cavity in the substrate; and
   an interdigital transducer (IDT) formed on the front surface of the lithium niobate plate such that interleaved fingers of the IDT are disposed on the diaphragm, the IDT and the lithium niobate plate configured such that a radio frequency signal applied to the IDT excites a shear primary acoustic mode within the diaphragm, wherein
   the Euler angles of the lithium niobate plate are [0°, $\beta$, 90°], where $\beta$ is greater than or equal to −15° and less than 0°.

2. The device of claim 1, wherein $\beta$ is greater than or equal to −11° and less than or equal to −5°.

3. The device of claim 2, wherein $\beta$ is greater than or equal to −10° and less than or equal to −7.5°.

4. The device of claim 1, wherein a direction of acoustic energy flow of the primary acoustic mode is substantially normal to the front and back surfaces of the diaphragm.

5. The device of claim 1, wherein a thickness between the front and back surfaces of the lithium niobate plate is greater than or equal to 200 nm and less than or equal to 1000 nm.

6. The device of claim 1, wherein a pitch of the fingers of the IDT is greater than or equal to 2 times the thickness of the lithium niobate plate and less than or equal to 25 times the thickness of the lithium niobate.

7. The device of claim 6, wherein
   the fingers of the IDT have a width, and
   the pitch is greater than or equal to 2 times the width and less than or equal to 25 times the width.

8. The device of claim 1, further comprising:
   a front-side dielectric layer formed on the front surface of the lithium niobate plate over and/or between the fingers of the IDT.

9. The device of claim 1, wherein the IDT comprises one of aluminum, an aluminum alloy, copper, a copper alloy, beryllium, molybdenum, and gold.

10. The device of claim 1, wherein
    the IDT is oriented such that the fingers of the IDT are parallel to the crystalline x-axis of the lithium niobate plate.

11. A filter device, comprising:
    a substrate;
    a rotated z-cut lithium niobate plate having front and back surfaces, the back surface attached to the surface of the substrate, portions of the lithium niobate plate forming one or more diaphragms spanning respective cavities in the substrate; and
    a conductor pattern formed on the front surface, the conductor pattern including a plurality of interdigital transducers (IDTs) of a respective plurality of acoustic resonators, interleaved fingers of each of the plurality of IDTs disposed on the one or more diaphragms, wherein the lithium niobate plate and all of the IDTs are configured such that respective radio frequency signals applied to the IDTs excite respective shear primary acoustic modes within the respective diaphragms, and the Euler angles of the rotated z-cut lithium niobate plate are 0°,β, 90°, where β is greater than or equal to −15° and less than 0°.

12. The filter device of claim 11, wherein β is greater than or equal to −11° and less than or equal to −5°.

13. The filter device of claim 12, wherein β is greater than or equal to −10° and less than or equal to −7.5°.

14. The filter device of claim 11, wherein a direction of acoustic energy flow of all of the primary acoustic modes is substantially orthogonal to the front and backs surfaces of the respective diaphragms.

15. The filter device of claim 11, wherein a thickness between the front and back surfaces of the single-crystal lithium niobate is greater than or equal to 200 nm and less than or equal to 1000 nm.

16. The filter device of claim 11, wherein each of the plurality of IDTs is disposed on a respective diaphragm spanning a respective cavity.

17. A method of fabricating an acoustic resonator device, comprising:

bonding a rotated z-cut lithium niobate plate to a substrate;

forming a cavity in the substrate, before or after bonding the lithium niobate plate to the substrate, such that a portion of the lithium niobate plate forms a diaphragm spanning the cavity; and forming an interdigital transducer (IDT) on a front surface of the lithium niobate plate such that interleaved fingers of the IDT are disposed on the diaphragm, the IDT and the lithium niobate plate configured such that a radio frequency signal applied to the IDT excite~ a shear primary acoustic mode within the diaphragm, wherein the Euler angles of the rotated z-cut lithium niobate plate are 0°,β, 90°, where β is greater than or equal to −15° and less than 0°.

18. The method of claim 17, wherein β is greater than or equal to −11° and less than or equal to −5°.

19. The method of claim 18, wherein β is greater than or equal to −10° and less than or equal to −7.5°.

20. The method of claim 17, wherein a direction of acoustic energy flow of the primary acoustic mode is substantially normal to the front and back surfaces of the diaphragm.

* * * * *